(12) United States Patent
Sethi

(10) Patent No.: US 9,759,751 B1
(45) Date of Patent: Sep. 12, 2017

(54) LINE CYCLE CORRELATED SPECTRAL ANALYSIS FOR POWER MEASUREMENT SYSTEMS

(71) Applicant: Cirrus Logic, Inc., Austin, TX (US)

(72) Inventor: Shruti Sethi, Cedar Park, TX (US)

(73) Assignee: Cirrus Logic, Inc., Austin, TX (US)

(*) Notice: Subject to any disclaimer, the term of this patent is extended or adjusted under 35 U.S.C. 154(b) by 777 days.

(21) Appl. No.: 13/740,014

(22) Filed: Jan. 11, 2013

Related U.S. Application Data

(60) Provisional application No. 61/585,964, filed on Jan. 12, 2012.

(51) Int. Cl.
*G01R 21/06* (2006.01)
*G01R 21/133* (2006.01)
*G06F 17/00* (2006.01)

(52) U.S. Cl.
CPC .......... *G01R 21/133* (2013.01); *G06F 17/00* (2013.01)

(58) Field of Classification Search
CPC ................................ G01R 21/133; G06F 17/00
USPC ............................................................. 702/60
See application file for complete search history.

(56) References Cited

U.S. PATENT DOCUMENTS

| | | | | |
|---|---|---|---|---|
| 5,528,134 A | * | 6/1996 | Davis | G01R 23/16 324/76.21 |
| 5,587,917 A | * | 12/1996 | Elms | G01R 21/1331 702/66 |
| 6,094,622 A | * | 7/2000 | Hubbard et al. | G01R 19/2513 702/61 |
| 6,128,584 A | * | 10/2000 | Hemminger et al. | G01R 21/133 324/142 |
| 7,756,651 B2 | * | 7/2010 | Holdsclaw | 702/60 |
| 2006/0129339 A1 | * | 6/2006 | Bruno | 702/60 |
| 2009/0228224 A1 | * | 9/2009 | Spanier et al. | 702/60 |
| 2011/0080197 A1 | * | 4/2011 | Fan | G01R 19/02 327/156 |

* cited by examiner

*Primary Examiner* — Stephanie Bloss
(74) *Attorney, Agent, or Firm* — Kent B. Chambers; Terrile, Cannatti, Chambers & Holland, LLP

(57) ABSTRACT

In one embodiment, a system and method perform a spectral analysis in a power measurement system to determine the total harmonic distortion ("THD") in a power signal by correlating one or more THD calculation parameters to a sensed period of a voltage input signal. In at least one embodiment, the one or more THD calculation parameters are a number of samples of a voltage, current, or voltage and current components of the power signal that correlate to the sensed period. Because, for example, the period of the power signal can vary or the clock frequency can drift over time, the power measurement system correlates the number of samples with the period and, thus, varies the count of samples over which THD is calculated when the period varies. By correlating the samples with the period, the samples more closely represent a period of the sampled component of the power signal.

24 Claims, 8 Drawing Sheets

LINE CYCLE CORRELATED SPECTRAL ANALYSIS FOR POWER MEASUREMENT SYSTEMS

CROSS-REFERENCE TO RELATED APPLICATION

This application claims the benefit under 35 U.S.C. §119 (e) and 37 C.F.R. §1.78 of U.S. Provisional Application No. 61/585,964 filed on Jan. 12, 2012, and entitled "Efficient Window-Free Spectral Analysis", which is incorporated by reference in its entirety.

BACKGROUND OF THE INVENTION

Field of the Invention

The present invention relates in general to the field of electronics, and more specifically to a system and method for line cycle correlated spectral analysis for power measurement systems.

Description of the Related Art

Utility companies and other companies provide electrical power to many customers. The particular loads that utilize the electrical power can affect the quality of the delivered power. Total harmonic distortion ("THD") represents one measure of the quality of the delivered power. Utility power transmission equipment and some loads are sensitive to the THD and non-linear loads typically increase the THD. THD is a line quality metric. Power is typically delivered with a line voltage having a fundamental line frequency. For example, the fundamental line frequency of the line voltage is 60 Hz in the United States of America and is 50 Hz in Europe. One way to calculate the THD of a signal is by taking the ratio of the total root mean square ("RMS") of the signal at frequencies other than the fundamental line frequency to the total RMS. Equation 1 represents one measure of the THD in terms of a current component of the electrical power delivered to the load, and Equation 2 represents one measure of the THD in terms of a voltage component of the electrical power delivered to the load:

$$THD_I = \frac{I_{H\_RMS}}{I_{RMS}} \qquad \text{Equation 1}$$

$$THD_V = \frac{V_{H\_RMS}}{V_{RMS}} \qquad \text{Equation 2}$$

In Equation 1, $I_{H\_RMS}$ represents the root mean square of the current at harmonic frequencies of the fundamental line frequency, and $I_{RMS}$ represents the total root mean square of the current (which includes the fundamental line frequency and all harmonic frequencies). As previously stated, the fundamental line frequency is 60 Hz for the United States of America and 50 Hz for Europe. In Equation 2, $V_{H\_RMS}$ represents the root mean square of the line voltage at harmonic frequencies of the fundamental line frequency, and $V_{RMS}$ represents the total root mean square of the voltage (which includes the fundamental line frequency and all harmonic frequencies).

Equation 3 represents a calculation of $I_{H\_RMS}$, and Equation 4 represents a calculation of $V_{H\_RMS}$:

$$I_{H\_RMS} = \sqrt{I_{RMS}^2 - I_{F\_RMS}^2} \qquad \text{Equation 3}$$

$$V_{H\_RMS} = \sqrt{V_{RMS}^2 - V_{F\_RMS}^2} \qquad \text{Equation 4}$$

In Equation 3, $I_{H\_RMS}$ represents the root mean square of the current at harmonic frequencies of the fundamental line frequency, $I_{RMS}^2$ is the square of total root mean square of the current delivered to the load, and $I_{F\_RMS}$ is the square of root mean square of the current delivered to the load at the fundamental line frequency. Similarly in Equation 4, $V_{H\_RMS}$ represents the root mean square of the line voltage at harmonic frequencies of the fundamental line frequency, $V_{RMS}^2$ is the square of total root mean square of the voltage delivered to the load, and $V_{F\_RMS}^2$ is the root mean square of the voltage delivered to the load at the fundamental line frequency.

FIG. 1 depicts a power distribution and measurement system 100 that includes a voltage source 102 that provides a supply input voltage V and a current I to a load 104. The voltage V is, for example, a nominally 60 Hz/110 V line voltage in the United States of America or a nominally 50 Hz/220 V line voltage in Europe. The power distribution and measurement system 100 also includes a power measurement system 106 to determine the THD of the power delivered to the load 104. Normally the input voltage V is well regulated, so the THD in terms of the voltage is relatively small. However, the THD of the current I can vary significantly depending upon the load 104. Thus, a power measurement system 104 senses the input current I and determines the total harmonic distortion of the power delivered to the load 104 in terms of the input current I as, for example, defined in Equation 1.

The power measurement system 106 includes a THD processor 108 to determine the THD of the power delivered to the load 104 in terms of the current. The THD processor 108 is a digital signal processor and, thus, operates on samples I(n) of the current I in the discrete time domain, where "n" is a discrete index value. The THD processor 108 performs a spectral analysis of the sampled current I(n). Several algorithms exist to perform the spectral analysis. The Goertzel algorithm is one of the most computationally efficient digital signal processing technique for evaluating power at individual frequencies. Tn at least one embodiment, the THD processor 108 utilizes the Discrete Fourier Transform (DFT) algorithm to determine the THD. Equation 5 represents the DFT in the discrete time domain:

$$X(m) = \sum_{n=0}^{N-1} x(n)e^{-j2\pi mn/N} \qquad \text{Equation 5}$$

In Equation 5, X(m) represents the $m^{th}$ output frequency coefficient of some discrete time signal x(n), over the sample interval n=0 to n=N−1. For example, x(n) can be chosen to represent the samples of input current I. Then X(m) would represent the $m^{th}$ spectral component of current I. This $m^{th}$ spectral component is centered at $2\pi m/N$, wherein N is the total number of samples used to compute the THD. For the fundamental spectral component, m equals N times the line frequency $F_L$ divided by the sampling frequency $F_S$, i.e. $m=N \cdot F_L/F_S$. Equation 6 represents the calculation of $I_{F\_RMS}^2$ for Equation 3 in terms of Equation 5, and Equation 7 represents the calculation of $I_{RMS}^2$. The value $I_{RMS}$ is the total RMS of the current I, which includes the RMS of the fundamental frequency and all harmonics of the fundamental frequency for the current I. $I_{F\_RMS}$ is the RMS of the fundamental frequency only. $F_L$ is the fundamental line frequency and $F_S$ is the sampling frequency of the input current I.

$$I_{F\_RMS}^2 = \frac{\frac{x(m)^2}{(N/2)^2}}{2} \quad \text{Equation 6}$$

$$\text{Where } m = \frac{F_L}{F_S} * N$$

$$I_{RMS}^2 = \frac{1}{N} \sum_{n=0}^{n=N-1} I(n)^2 \quad \text{Equation 7}$$

Determination of the THD in terms of the voltage V is identical to determination in terms of the current I except that x(n) represents samples of the voltage V.

The THD processor 108 then makes the determination of the THD available by transmitting the THD determination via transmitter 110, via display 112, and/or stored in memory 114 for subsequent access.

FIG. 2 depicts waveforms 200 of an exemplary line input current I and sample clock signal $F_{S\_CLK}$ of the power distribution and measurement system 100. The clock signal $F_{S\_CLK}$ is depicted by a series of pulses 202 that are exaggerated in time for illustration purposes. The input current I is periodic with a fundamental line frequency of $F_L$. Referring to FIGS. 1 and 2, as previously stated, the THD processor 108 utilizes a fixed value of N samples for determination of the THD. However, the fundamental line frequency $F_L$ is not always constant and can slightly vary, such as between 59.99 Hz to 60.01 Hz. The frequency variation means that the number of samples N will not always represent an exact periodic waveform. For example, in the waveforms 200, the fundamental line frequency $F_L$ is slightly less than 60 Hz. Accordingly, as depicted within the dashed circle 204, at least the Nth sample of the input current I captures the beginning of a next period. When the N samples of the input current I do not represent a periodic waveform, spectral leakage occurs in the determination of the THD, and the spectral leakage represents an error in the calculation of the THD. Spectral leakage arises due to discontinuities at the end points of data sequences. Spectral measurements ideally require exact periodicity of the sampled input signal. In order to minimize spectral leakage, N should be chosen so that there is an integer number of cycles in the input data sequence of the frequency for which the THD is calculated. Typically, several windowing techniques are used to minimize discontinuity or the error from non-integer periodicity of the sampling clock and input signal within N samples. However, utilizing windows requires a significant amount of calculations that are expensive in terms of implementation in circuitry and expensive in terms of power utilized for each THD calculation. Furthermore, the fixed value of N results in spectral leakage when the line frequency of the current I varies.

SUMMARY OF THE INVENTION

In one embodiment of the present invention, a method includes, in a power measurement system, sensing an occurrence of a period of a periodic input voltage to a load. The method further includes, in the power measurement system, correlating one or more total harmonic distortion calculation parameters to the sensed period of the voltage input for determining total harmonic distortion of one or more components of power delivered to the load. The method also includes, in the power measurement system, determining the total harmonic distortion of the one or more components of power delivered to the load using the one or more calculation parameters and providing access to the determined total harmonic distortion.

In another embodiment of the present invention, a method includes, in a power measurement system, sensing an occurrence of a period of one or more cycles of a periodic input voltage to a load. The method further includes, in the power measurement system, sampling one or more components of power delivered to the load to obtain samples of the one or more components. The method also includes, in the power measurement system, correlating a count of the samples to the period of the input voltage. The method further includes, in the power measurement system, determining the total harmonic distortion of the one or more components of power delivered to the load using the correlating count of samples and providing access to the determined total harmonic distortion.

In a further embodiment of the present invention, an apparatus includes a power measurement system, wherein the power measurement system is configured to sense an occurrence of a period of a periodic input voltage to a load. The power measurement system is further configured to correlate one or more total harmonic distortion calculation parameters to the sensed period of the voltage input for determining total harmonic distortion of one or more components of power delivered to the load. The power measurement system is also configured to determine the total harmonic distortion of the one or more components of power delivered to the load using the one or more calculation parameters and provide access to the determined total harmonic distortion.

In another embodiment of the present invention, an apparatus includes a power measurement system, and the power measurement system is configured to sense an occurrence of a period of one or more cycles of a periodic input voltage to a load. The power measurement system is also configured to sample one or more components of power delivered to the load to obtain samples of the one or more components and correlate a count of the samples to the period of the input voltage. The power measurement system is further configured to determine the total harmonic distortion of the one or more components of power delivered to the load using the correlating count of samples and provide access to the determined total harmonic distortion.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

In one embodiment, a system and method perform a spectral analysis in a power measurement system to determine the total harmonic distortion ("THD") in a power signal by correlating one or more total harmonic distortion calculation parameters to a sensed period of a voltage input signal. In at least one embodiment, the one or more THD calculation parameters are a number of samples of a voltage, current, or voltage and current components of the power signal that correlate to the sensed period. Spectral analysis ideally has absolute periodicity of the input data samples. Because, for example, the period of the power signal can vary or the clock frequency can drift over time, in order to get a more accurate THD measurement, the power measurement system correlates the number of samples used for THD calculation with the period of the input voltage signal and, thus, varies the count of samples when the period varies. By correlating the samples with the period, the sampled voltage and/or current signal can achieve closer to exact periodicity. This closer correlation reduces spectral leakage and, thus, can improve the accuracy of the determined THD relative to a conventional fixed sample technology. Additionally, by correlating the one or more THD calculation parameters to the sensed period of the voltage input signal, in at least one embodiment, any need of windowing techniques is eliminated in the determination of the THD. Thus, embodiments of the system and method provide a window-free spectral analysis technique for determining THD. In at least one embodiment, the power measurement system utilizes the Goertzel algorithm with the variable sample count to perform the spectral analysis at the fundamental frequency of a voltage component of the power signal.

Figure 1:
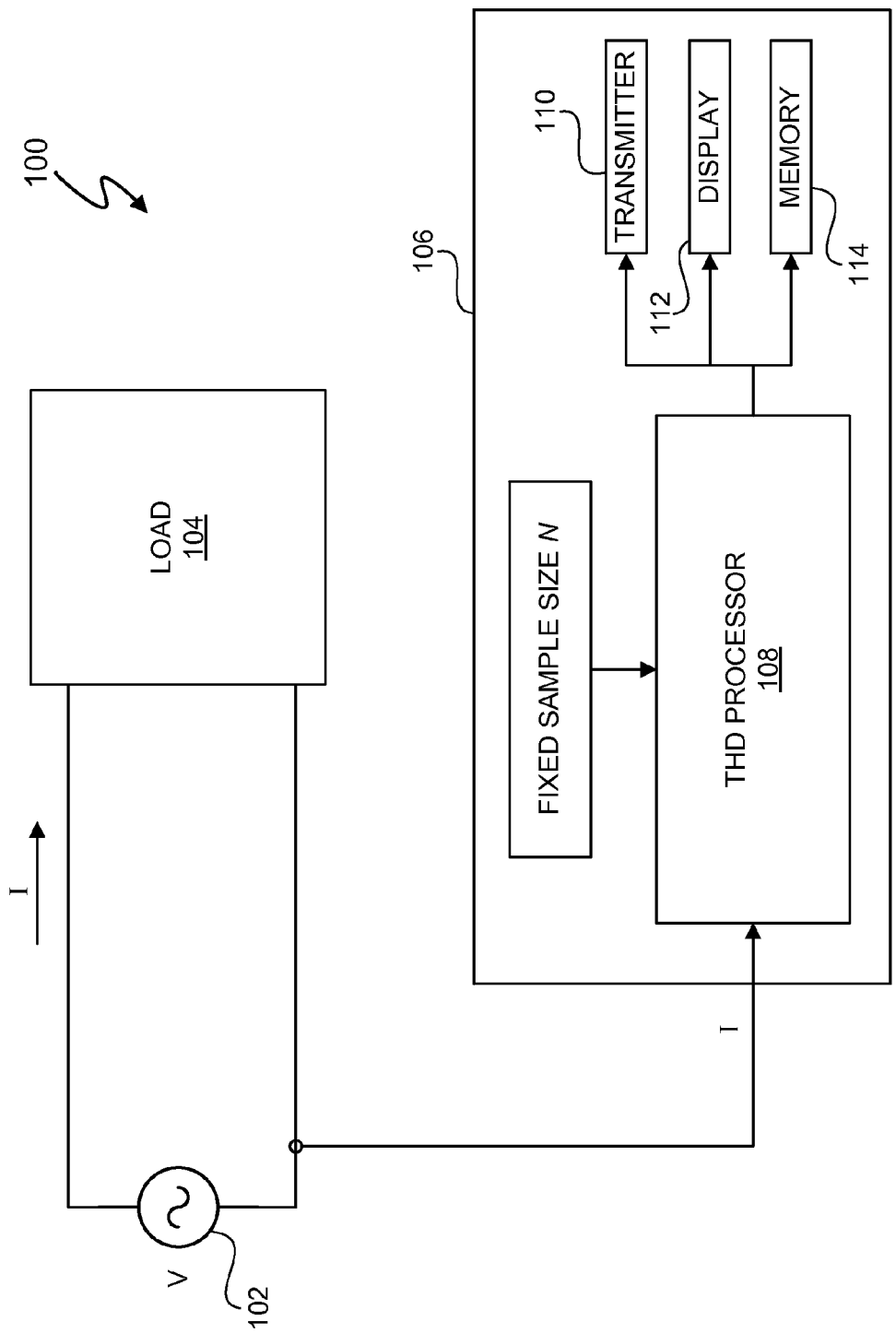
FIG. 1 (labeled prior art) depicts a power distribution and measurement system with a fixed number of samples used in determination of total harmonic distortion.
Figure 2:
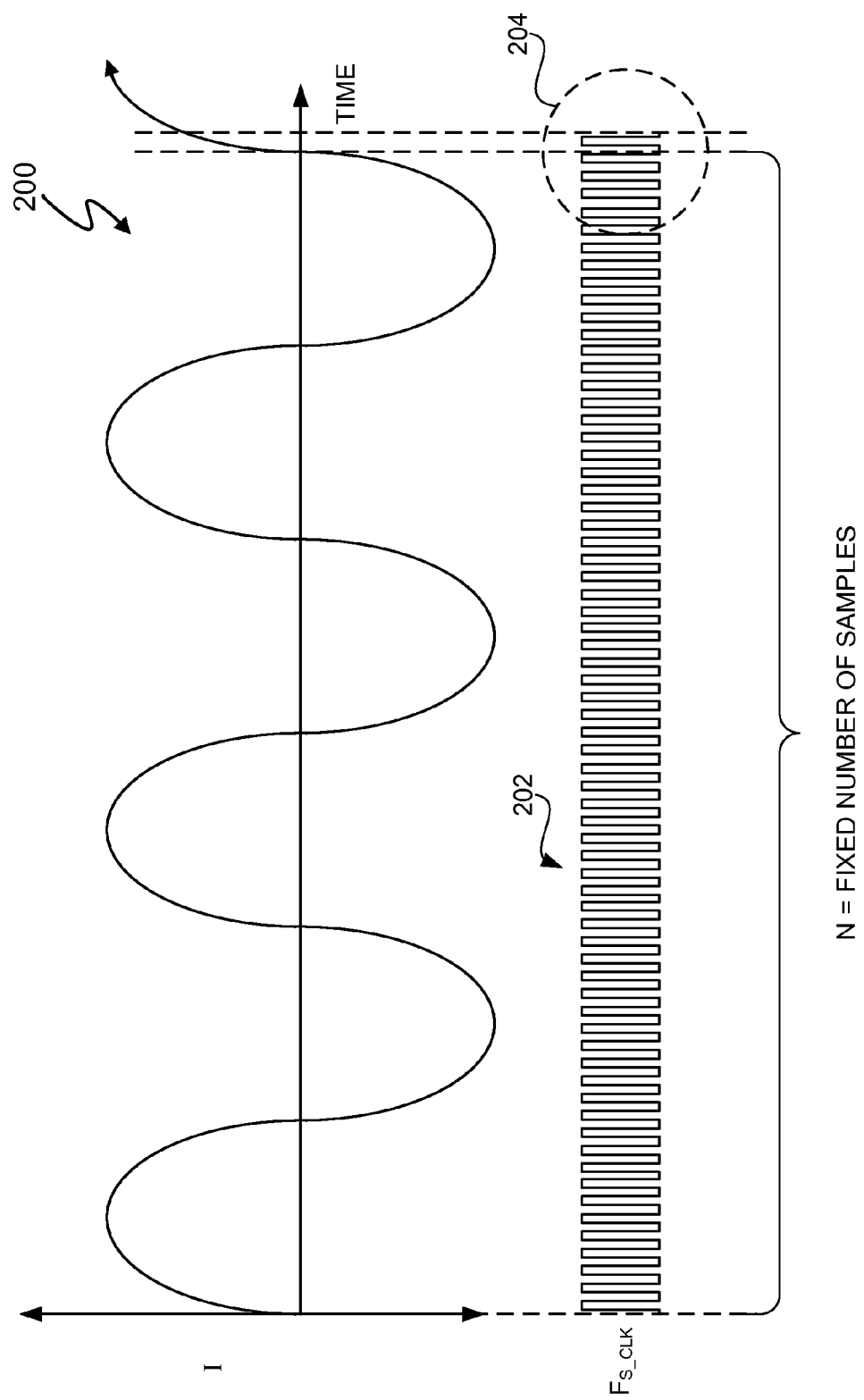
FIG. 2 (labeled prior art) depicts waveforms of an exemplary line input voltage and sample clock signal of the power distribution and measurement system of FIG. 1.
Figure 3:
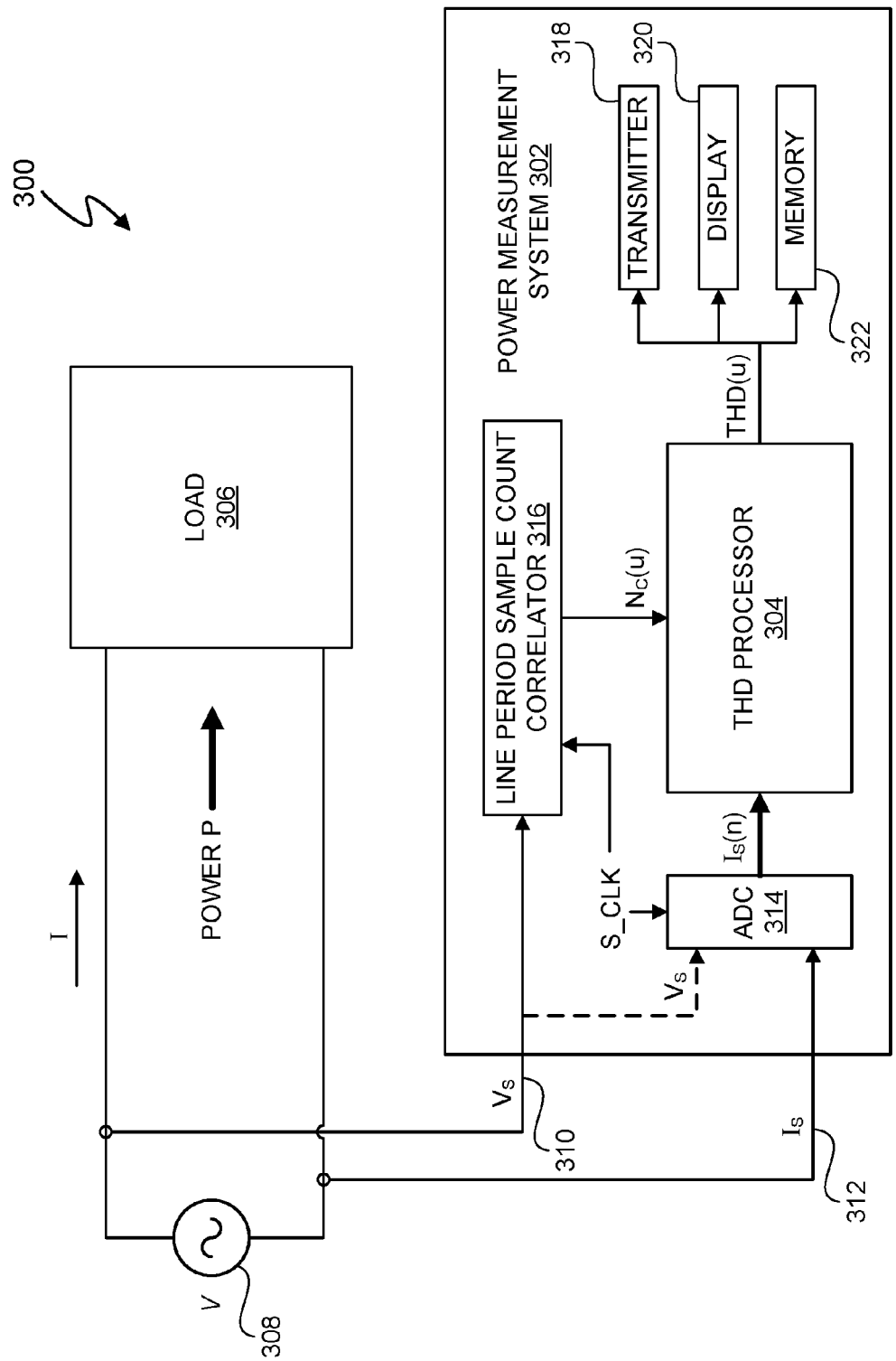
FIG. 3 depicts a power distribution and measurement system with correlated total harmonic distortion calculation parameters to a sensed period of a voltage input for determining total harmonic distortion.

FIG. 3 depicts a power distribution and measurement system 300 that includes a power measurement system 302. The power measurement system 302 can perform many well-known power distribution and measurement functions including determining the THD of one or more components of the power P provided to the load 306. Load 306 can be any type of electrical load including a resistive, a reactive, or a resistive and reactive load. In at least one embodiment, the one or more components include the voltage V generated by the voltage source 308, the current I provided to the load 306, or both the voltage V and current I components of the power P. The voltage source 308 can be any voltage source, and in at least one embodiment, the voltage source 308 is a line voltage source such as the voltage source 102. In at least one embodiment, the power measurement system 302 is a power meter that can be fixed or portable.

The power measurement system 302 includes an analog-to-digital converter 314, which receives a sample clock signal S_CLK. In at least one embodiment, the analog-to-digital converter 314 samples an input signal at the same frequency as the sample clock signal S_CLK, and the frequency of the clock signal is $F_{S\_CLK}$. The analog-to-digital converter 314 optionally (as indicated by the dashed line) samples a voltage $V_S$ via a channel 310 and samples a current $I_S$ via a channel 312 at a sample frequency of $F_{S\_CLK}$. The analog-to-digital converter 314 provides the samples $I_S(n)$ (and/or $V_S(n)$) to the THD processor 304. To determine the count of samples of the sensed current $I_S$ and optionally, the sensed voltage $V_S$ for accurate THD measurements, the power measurement system 302 includes a line period sample count correlator 316. The line period sample count correlator 316 receives the sampled voltage $V_S$ and also receives the sample clock signal S_CLK. The line period sample count correlator 316 correlates a count of the samples of the sampled voltage $V_S$ to a period of the sensed voltage $V_S$ by determining a number of counts of the samples of the sampled voltage $V_S$ that occur during some integer number of periods of the voltage V. The line period sample count correlator 316 generates a variable, correlated sample count $N_C(u)$ that represents the number of counts of the samples of the sampled voltage $V_S$ that occur during the period of the voltage V. "u" is an index variable representing the $u^{th}$ determination of the variable, correlated sample count $N_C(u)$. In at least one embodiment, "u" represents the $u^{th}$ period of the voltage V. In at least one embodiment, the power measurement system 302 measures the THD of the current I and determines the number of samples $N_C(u)$ for THD calculation that most closely correlate to a period of the current I and/or the voltage V. However, the current I may be of low quality or amplitude. In at least one embodiment, the power distribution and measurement system 300 is similar to a conventional utility power system where the line frequency of the current signal I is generally the same as the line frequency of the voltage signal V. In at least one embodiment, the power distribution and measurement system 300 utilizes the higher quality and potentially less variable voltage signal V to estimate the line frequency to obtain the proper number of samples $N_C(u)$ for determining the THD of the current signal I since the value of $N_C(u)$ for the voltage V and current I is, in at least one embodiment, identical for a conventional utility system.

The sensed voltage V is cyclic at a frequency of, for example, approximately 60 Hz in the United States of America and approximately 50 Hz in Europe. Thus, in at least one embodiment, the period of the voltage V determined by the line period sample count correlator 316 is one or more cycles of the voltage V. The process of determining the period of the voltage V is a matter of design choice. In at least one embodiment, any detectable or determined periodic feature of the voltage V can be used, such as zero crossings of the voltage V. In at least one embodiment, the accuracy of the variable, correlated sample count $N_C(u)$ and, thus, the accuracy of the THD(u) value determined by the THD processor 304 increases as the number of cycles of the voltage V included in the period increases. The THD(u) value represents the THD determined by the THD processor 304 for the $u^{th}$ value of the variable, correlated sample count $N_C(u)$. However, increasing the number of cycles in the period might also increase the update time of the determined THD.

The THD processor 304 determines the THD(u) value of at least one component of the power P provided to the load 306 by correlating THD calculation parameters to the period of the voltage input V to determine the THD. In at least one embodiment, the power P consists of two components, voltage V and the current I. In at least one embodiment, the THD of the voltage V is very small and is generally not of particular interest. However, the THD of the current I can be significant as the load 306 changes over time and/or based on the nature of the load 306, e.g. a resistive, reactive, or resistive and reactive load or even a non-linear load. Thus, in at least one embodiment, the THD processor 304 generates the THD(u) value of the current I. In other embodiments, the THD processor 304 generates the THD(u) for the voltage V only or both the current I and the voltage V. In at least one embodiment, the THD of the current I and the voltage V are defined as in respective Equation 1 and Equation 2. The harmonic root mean square of current I and voltage V are defined as in respective Equation 3 and Equation 4.

The particular manner of performing a spectral analysis of the current I and/or the voltage V to determine the THD(u) is a matter of design choice. For example, in at least one embodiment, the THD processor 304 utilizes the Goertzel algorithm at the fundamental frequency of the voltage V, which, in at least one embodiment, is also the fundamental frequency of the current I. In other embodiments, the THD processor 304 utilizes, for example, a Fourier transform or a fast Fourier transform. A general discrete Fourier transform (DFT) algorithm computes spectral power evenly across the bandwidth of an incoming signal. The Goertzel algorithm computes spectral power at a specific predetermined frequency of interest which, in at least one embodiment, is the line voltage frequency $F_L$.

Since the voltage V has one specific fundamental line frequency $F_L$ the THD processor 304 utilizes the Goertzel algorithm to determine the THD(u) values in accordance with the variable, correlated sample count $N_C(u)$ at this frequency, $F_L$. Equation 8 represents the Goertzel algorithm in the discrete time domain utilizing the variable, correlated sample count $N_C(u)$:

$$X(m)_C = \sum_{n=0}^{N_C(u)-1} x(n) e^{-j2\pi mn/N_C(u)} \quad \text{Equation 8}$$

In Equation 8, $X(m)_C$ represents the output frequency coefficient for samples $x(n)$ of the current I starting at sample $x(0)$ through sample $x(N_C(u)-1)$ and represents a frequency of $[m/N_C(u)] \cdot Fs$ Hz. "$N_C(u)$" is the total number of samples used to compute the THD(u) for the $u^{th}$ period of the voltage V for which the THD(u) is determined. Since the fundamental line frequency $F_L$ of the voltage V is actually not constant, as previously discussed, the number of samples $N_C(u)$ represents the number of samples used for determination of the THD(u). "m" equals $[(F_L/F_S) \cdot N_C(u)]$, where $F_L$ is the fundamental line frequency of the input current I and voltage V, and $F_S$ is the sampling frequency. Equation 9 represents the calculation of the magnitude of $I_{F\_RMS}^2$ for Equation 3 in terms of Equation 5, and Equation 10 represents the calculation of the magnitude of $I_{RMS}^2$ which includes the fundamental and all its harmonic frequencies $F_L$.

$$I_{F\_RMS}^2 = \frac{\frac{X(m)^2}{(N/2)^2}}{2}, \text{ where } m = \frac{F_L}{F_S} * Nc(u) \quad \text{Equation 9}$$

$$I_{RMS}^2 = \frac{1}{N_C(u)} \sum_{n=0}^{n=N_C(u)-1} I(n)^2 \quad \text{Equation 10}$$

Determination of the THD(u) for the voltage V is identical to determination for the current I except that $x(n)$ in Equation 8 represents samples of the voltage V.

The THD processor 304 can be implemented using, for example, discrete or integrated circuits. In at least one embodiment, the Goertzel algorithm of Equation 8 is implemented in firmware in accordance with the pseudocode:

Coeff=cos(2πϵ)
d1=0, d2=0
For i=1:$N_C(u)$
y=Iin+2·coeff·d1−d2
d2=d1
d1=y
End
$I_{F\_RMS}^2$=d1·d1+d2·d2−2·coeff·d1·d2 where ϵ equals $F_L/F_{S\_CLK}$. $F_L$ is the fundamental line frequency, and $F_{S\_CLK}$ is the sampling frequency. Intermediate results d1 and d2 grow in the recursive computation when the input signal to the THD processor 304 contains the 'm' frequency component that the Goertzel algorithm is 'tuned' to extract. Final amplitude of d1 and d2 depends on the block size $N_C(u)$. In at least one of the embodiment, the input signal is scaled to prevent d1 and d2 from getting too big for a fixed-point implementation of the algorithm. The foregoing pseudocode can also be used to calculate the THD for the voltage V by substituting "Vin" for "Iin" and "$V_{F\_RMS}^2$" for "$I_{F\_RMS}^2$".

Figure 4:
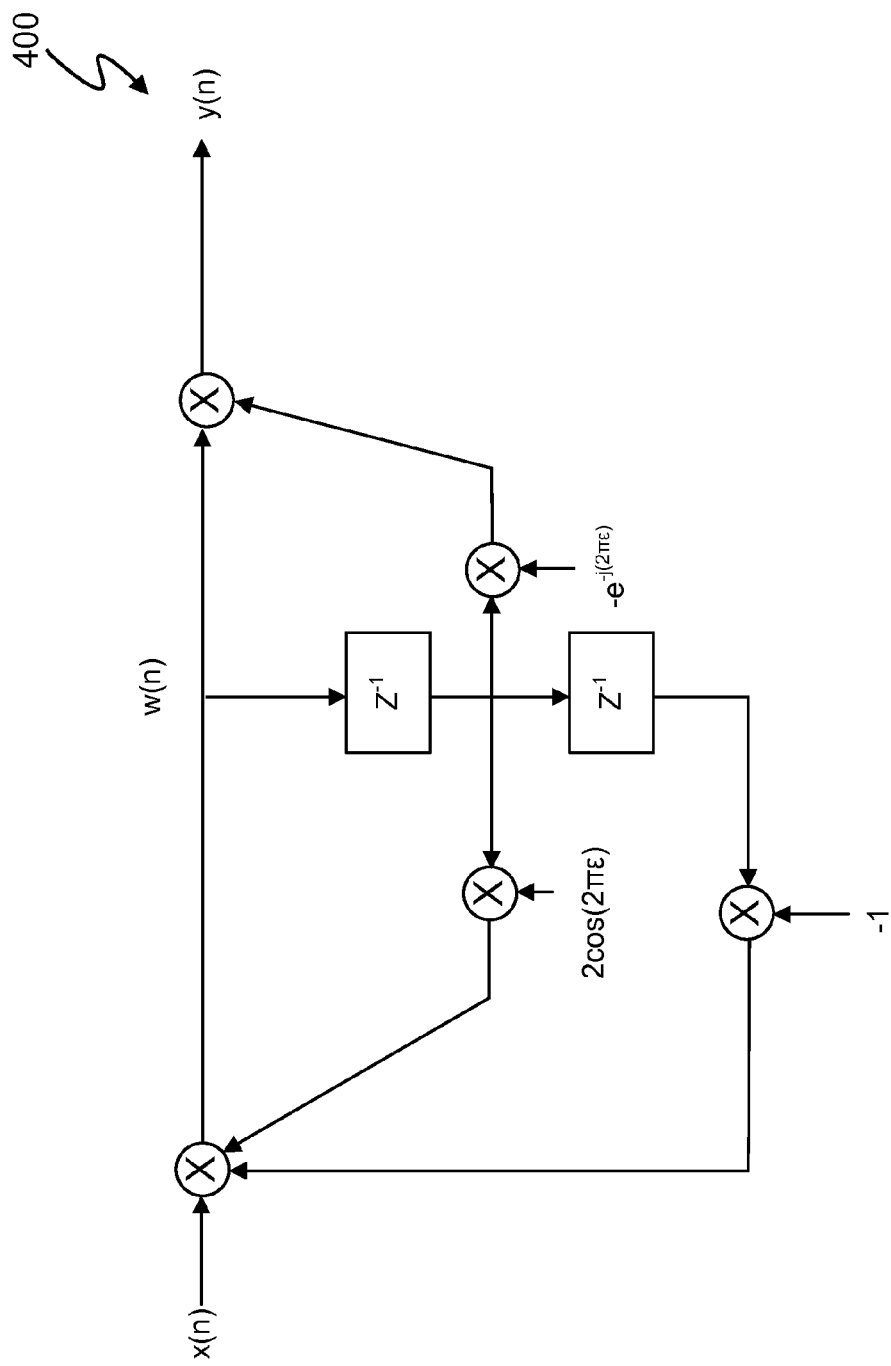
FIG. 4 depicts a Goertzel algorithm implementation filter.

FIG. 4 depicts a Goertzel algorithm Equation 8 implementation filter 400. The following equations represent the operation of the filter 400 for the fundamental frequency of interest:

$$w(n)=2 \cos [2 \pi m/N_C(u)] \cdot w(n-1) - w(n-2) + x(n) \quad \text{Equation 11}$$

$$y(n)=w(n)-e^{-j2\pi nm/N_C(u)} \cdot w(n-1) \quad \text{Equation 12}$$

$$|X(m)|^2=|y(n-1)|^2 \quad \text{Equation 13}$$

$$|X(m)|^2 = \quad \text{Equation 14}$$
$$w(n-1)^2 + w(n-1)^2 - w(n-1) \cdot w(n-2) \cdot \left(2\cos\frac{2\pi m}{N_C(u)}\right)$$

"m" equals $[(F_L/F_S) \cdot N]$, where $F_L$ is the fundamental line frequency of the input current I and $F_S$ is the sampling frequency.

The THD processor 304 then makes the determination of the THD(u) available by transmitting the THD determination via transmitter 318, via display 320, and/or stored in memory 322 for subsequent access.

Figure 5:
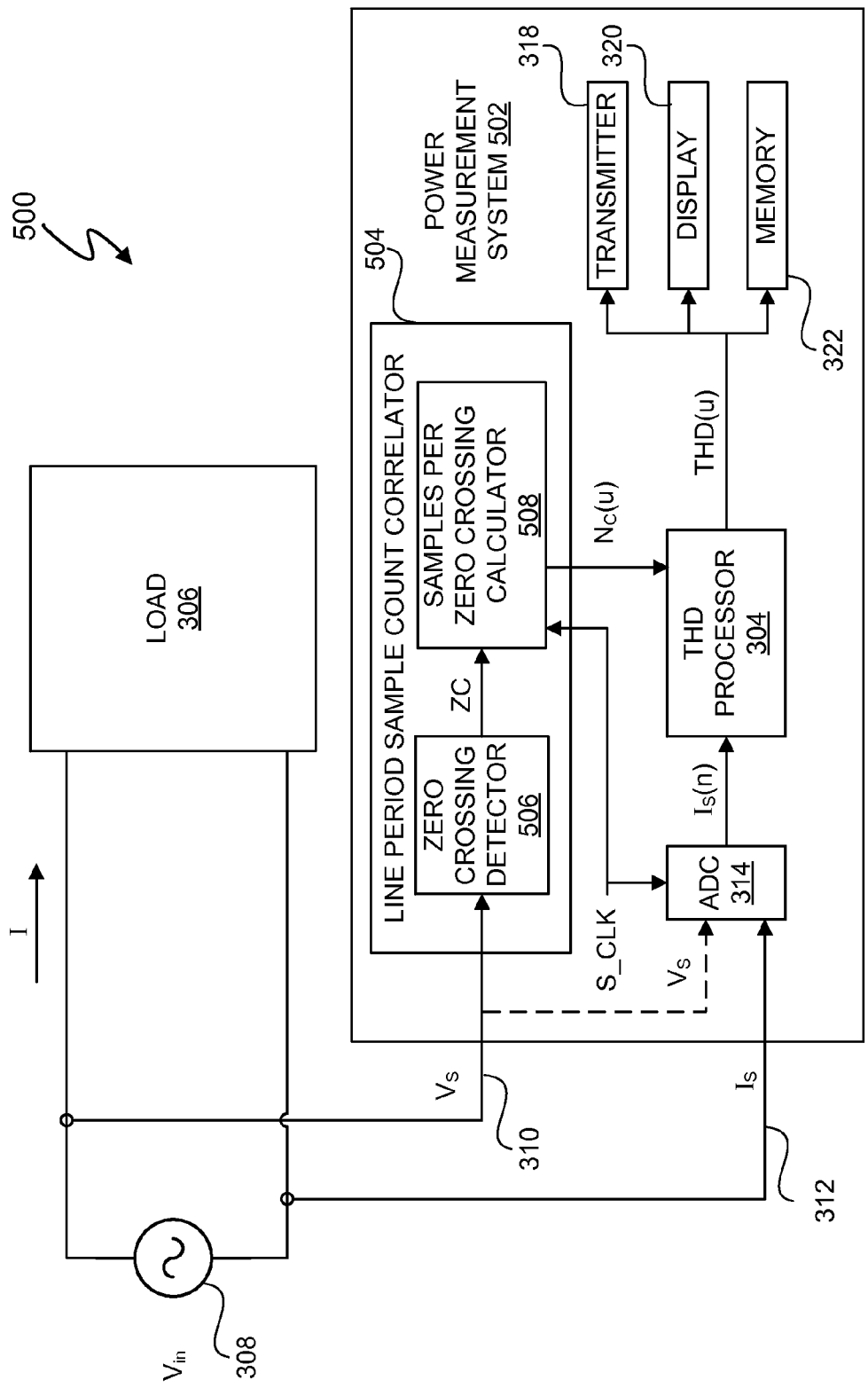
FIG. 5 depicts a power distribution and measurement system that represents one embodiment of the power distribution and measurement system of FIG. 3.
Figure 6:
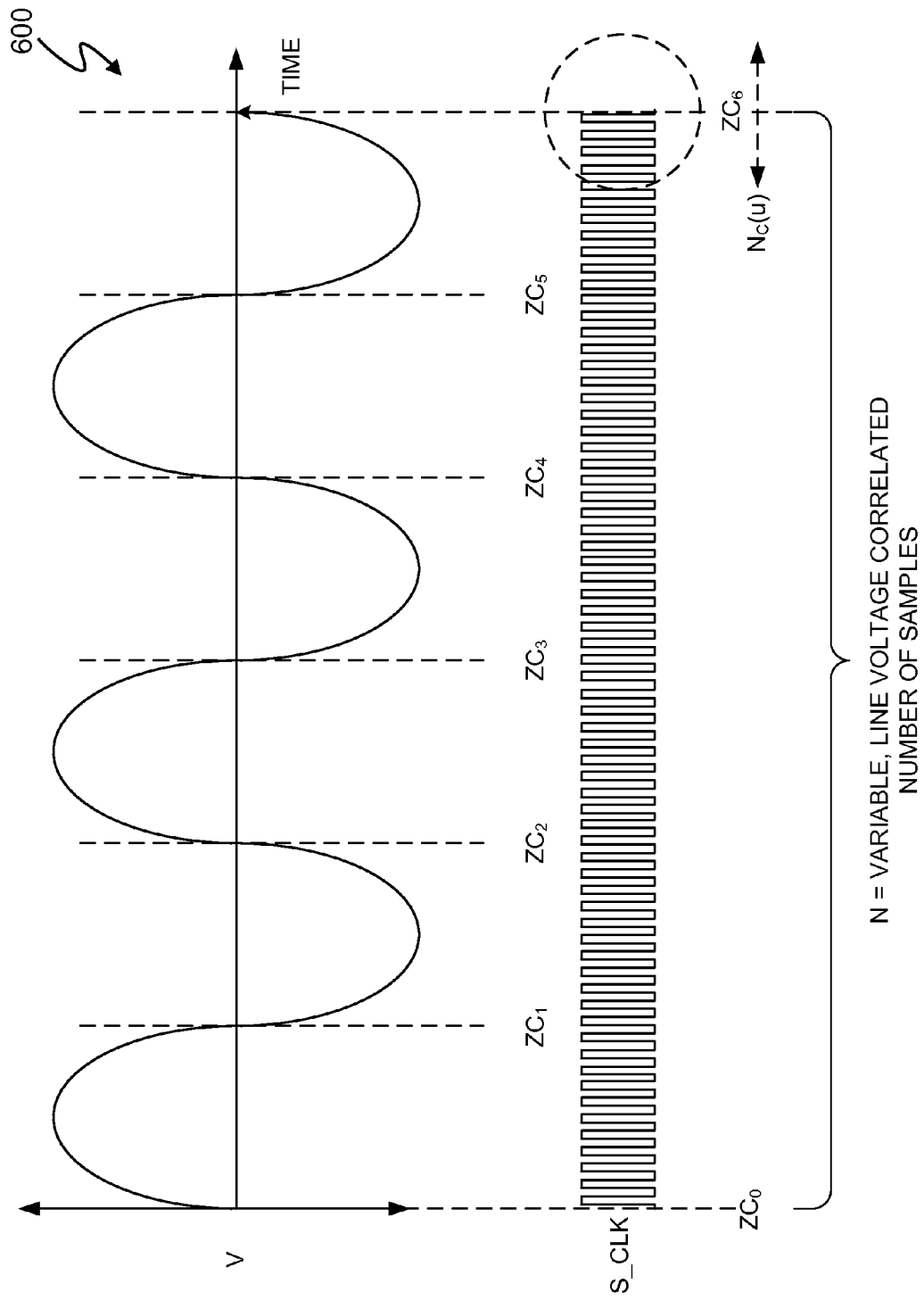
FIG. 6 depicts waveforms of an exemplary line input voltage V and sample clock signal of the power distribution and measurement system of FIG. 5.
Figure 7:
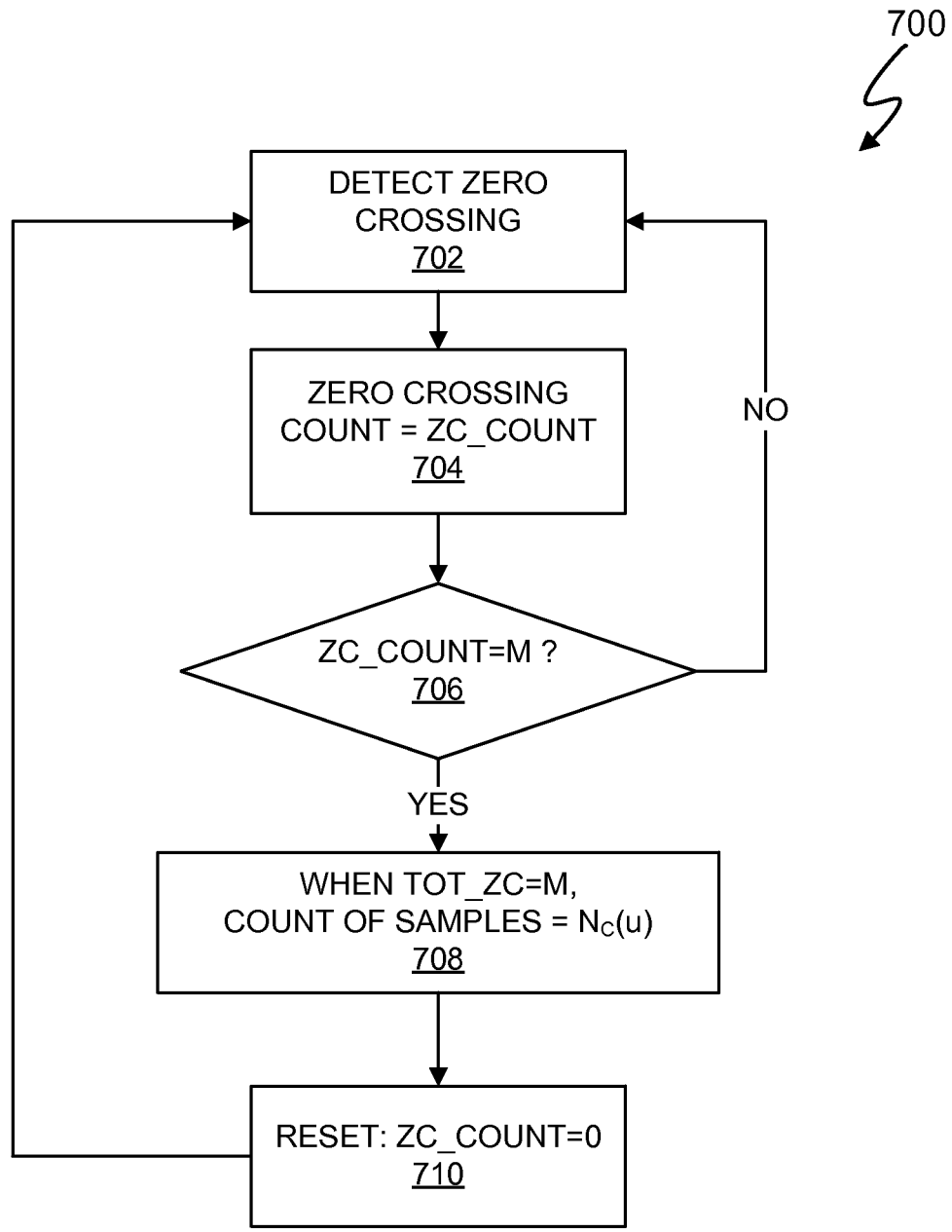
FIG. 7 depicts variable, correlated sample count determination process.

FIG. 5 depicts a power distribution and measurement system 500, which represents one embodiment of the power distribution and measurement system 300. The power distribution and measurement system 500 includes a power measurement system 502, and the power measurement system 502 includes a line period sample count correlator 504 that determines the variable, correlated sample count $N_C(u)$ by determining a period of the voltage V using zero crossings of the voltage V. The line period sample count correlator 504 represents one embodiment of the line period sample count correlator 316. FIG. 6 depicts waveforms 600 of an exemplary line input voltage V and sample clock signal S_CLK of the power distribution and measurement system 500. FIG. 7 depicts variable, correlated or correlated sample count determination process 700, which represents one embodiment of the operation of the line period sample count correlator 504.

Referring to FIGS. 5, 6, and 7, in operation 702, the zero crossing detector 506 detects the zero crossings of the voltage V and provides a zero crossing signal ZC to the samples per zero crossing correlator 504. The zero crossing signal ZC represents an indication of the zero crossings of the voltage V. The zero crossings occur when the voltage V reaches approximately zero volts at the end of each half cycle of the voltage V. In at least one embodiment, the analog-to-digital converter 314 obtains a sample of the current I and/or the voltage V every pulse of the sample clock signal S_CLK. The analog-to-digital converter 314 provides the samples $I_S(n)$ (and/or $V_S(n)$) to the THD processor 304. "n" is an index value ranging from 1 to the variable, correlated sample count $N_C(u)$. The frequency of the sample clock signal is $F_{S\_CLK}$. In operation 704, the samples per zero crossing correlator 508 sets a count of the number of zero crossings equal to a value ZC_COUNT. In operation 706, the samples per zero crossing correlator 508 determines if the count of zero crossings ZC_COUNT equals M, where M represents the number of zero crossings of the voltage Vin a period of the voltage V for which the variable, correlated sample count $N_C(u)$ is determined. If the ZC_COUNT does not equal M, the variable, correlated sample count determination process 700 returns to operation 702. When ZC_COUNT equals M, operation 708 sets the value of variable, correlated sample count $N_C(u)$ to the count of samples of the current $I_S(n)$. In at least one embodiment, the samples per zero crossing correlator 504 determines the variable, correlated sample count $N_C(u)$ by tracking the number of pulses of the sample clock signal S_CLK that occur from the first zero crossing $ZC_0$ of the $u^{th}$ period of the voltage V until the $M^{th}$ zero crossing of $u^{th}$ period of the voltage V. In the embodiment of the waveforms 600 in FIG. 6, M equals 7. However, the value of M is a matter of design choice. In at least one embodiment, the accuracy of the variable, correlated sample count $N_C(u)$ and, thus, the accuracy of the THD(u) value determined by the THD processor 304 increases as the value of M increases. However, increasing the value of M might also increase the update time of the determined THD.

In operation 708, the samples per zero crossing correlator 504 sets the value of variable, correlated sample count $N_C(u)$ to the count of samples by the analog-to-digital converter 314 that occur when the value of ZC_COUNT equals M. Thus, the variable, correlated sample count $N_C(u)$ equals the count of samples during the $u^{th}$ period, and the variable, correlated sample count $N_C(u)$ correlates the count of samples to the $u^{th}$ period of the voltage V. In operation 710, the samples per zero crossing correlator 504 resets the zero crossing count ZC_COUNT to zero, and the variable, correlated sample count determination process 700 returns to operation 702. Since the frequency of the voltage V can change slightly over time, the value of variable, correlated sample count $N_C(u)$ also changes to provide a more accurate correlation between the sample count of the current $I_S(n)$ and/or the voltage $V_S(n)$ during each period of the voltage V. The THD(u) value represents the THD determined by the THD processor 304 for the $u^{th}$ value of the variable, correlated sample count $N_C(u)$ as previously described. In experimental results, when the THD processor 304 utilizes the variable, correlated sample count $N_C(u)$ and the fundamental frequency of the voltage V varies between 58.8 Hz and 61.2 Hz or between 49 Hz and 51 Hz, the error in the THD calculation using waveforms described in the International Electrotechnical Commission (IEC) specifications for harmonic calculations was observed to be less than 1%.

Figure 8:
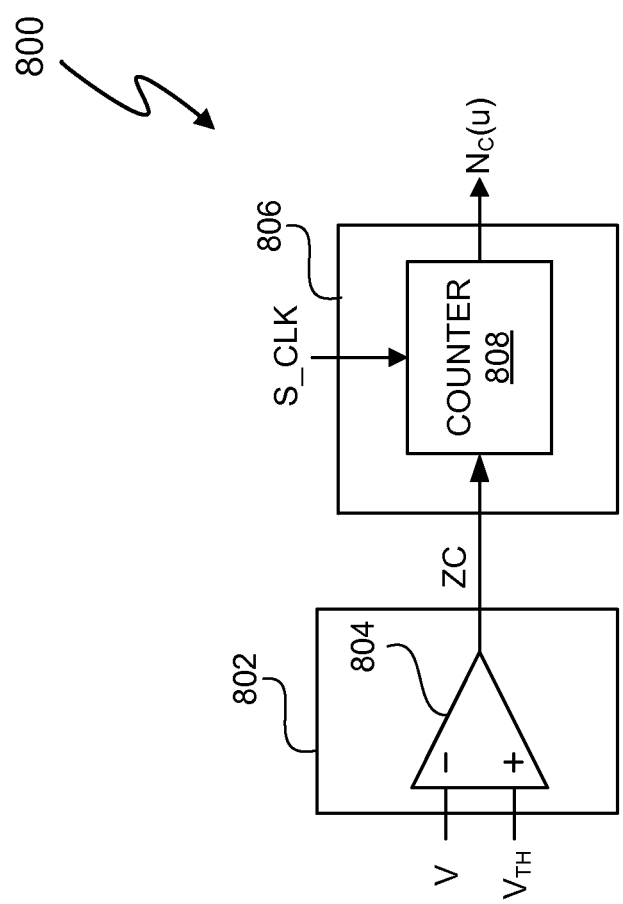
FIG. 8 depicts a line period sample count correlator.

FIG. 8 depicts a line period sample count correlator 800, which represents one embodiment of the line period sample count correlator 504. The zero crossing detector 802 includes a comparator 804 that compares the voltage V to a threshold voltage value $V_{TH}$. The threshold voltage value $V_{TH}$ is set to 0V or approximately 0V. When the voltage V transitions to less than the threshold voltage value $V_{TH}$, the zero crossing signal ZC transitions from a logical 1 to a logical 0. When the voltage V transitions to greater than the threshold voltage value $V_{TH}$, the zero crossing signal ZC transitions from a logical 0 to a logical 1. The samples per zero crossing correlator 806 includes a counter 808 that counts the number of pulses of the sample clock signal S_CLK that occur until the zero crossing value ZC equals M, the number of zero crossings in a period of the voltage V for which the variable, correlated sample count $N_C(u)$ is determined. When the zero crossing value ZC equals M, the samples per zero crossing correlator 806 provides the variable, correlated sample count $N_C(u)$ to the THD processor 304.

By utilizing the variable, correlated sample count $N_C(u)$ to determine the THD(u), the THD processor 304 utilizes a count of samples that more closely represents a period of the voltage V than the conventional fixed sample count since the period of the voltage V varies over time. Additionally, in at least one embodiment, the THD processor 304 performs the spectral analysis of the current I and/or the voltage V without using any windowing techniques so that the computational efficiency of Goertzel algorithm can be preserved.

Although embodiments have been described in detail, it should be understood that various changes, substitutions, and alterations can be made hereto without departing from the spirit and scope of the invention as defined by the appended claims.

What is claimed is:
1. A method comprising:
   in a power measurement system:
      sensing an occurrence of a period of a periodic input voltage to a load;
      obtaining samples of total harmonic calculation parameters;
      correlating an integer number of samples of the total harmonic distortion calculation parameters to the sensed period of the voltage input so that the integer number of samples used for determining total harmonic distortion of one or more components of power delivered to the load varies with changes in the period of the periodic input voltage;
      determining the total harmonic distortion of the one or more components of power delivered to the load using the integer number of samples of the total harmonic calculation parameters that are correlated with the sensed period of the input voltage and using only an integer number of full values of the total harmonic calculation parameters for each determination of the total harmonic distortion; and
      providing access to the determined total harmonic distortion.
2. The method of claim 1 further comprising:
   in the power measurement system:
      sampling the input voltage to the load, wherein the one or more total harmonic distortion calculation parameters comprises an integer number of samples of the input voltage that occur during X number of periods of the input voltage, wherein X is an integer greater than or equal to one; and determining the total harmonic distortion of the one or more components of power delivered to the load using the one or more calculation parameters comprises determining the total harmonic distortion of the one or more components of power delivered to the load using the integer number of samples of the input voltage that occur during X number of periods of the input voltage.

3. The method of claim 2 wherein the one or more components of power delivered to the load comprise one or more members of a group consisting of a current to the load and the input voltage to the load.

4. The method of claim 3 wherein determining the total harmonic distortion of the one or more components of power delivered to the load comprises determining the total harmonic distortion using a Goertzel algorithm based on a fundamental line frequency of the input voltage for the integer number of samples of the input voltage that occur during X number of periods of the input voltage.

5. The method of claim 1 wherein:
sensing an occurrence of a period of a periodic input voltage to a load comprises:
detecting a beginning and an ending zero crossing of each of P cycles of the periodic input voltage, where P is an integer greater than or equal to one; and
the method further comprises:
sampling the input voltage to the load; and
tracking an integer number of samples of the input voltage to the load that occur from a beginning zero crossing of the period of the periodic input voltage to a last zero crossing of the period of the periodic voltage; and
the one or more total harmonic distortion calculation parameters comprises the integer number of samples of the input voltage that occur from the beginning zero crossing of the first of the one or more periods of the periodic input voltage to the last zero crossing of the one or more periods of the periodic voltage.

6. The method of claim 1 wherein the period of the input voltage is P cycles of the periodic input voltage, where P is an integer greater than or equal to one.

7. A method comprising:
in a power measurement system:
sensing an occurrence of a period of a periodic input voltage to a load;
obtaining an integer number of samples of total harmonic calculation parameters;
correlating the integer number of samples of the total harmonic distortion calculation parameters to the sensed period of the voltage input so that the integer number of samples used for determining total harmonic distortion of one or more components of power delivered to the load varies with changes in the period of the periodic input voltage;
determining the total harmonic distortion of the one or more components of power delivered to the load using the integer number of samples of the total harmonic calculation parameters that are correlated with the sensed period of the input voltage and using only an integer number of full values of the total harmonic calculation parameters for each determination of the total harmonic distortion; and
providing access to the determined total harmonic distortion.

8. The method of claim 7 wherein determining the total harmonic distortion of the one or more components of power delivered to the load comprises determining the total harmonic distortion of the one or more components of power delivered to the load using an integer count of samples of the input voltage that occur during X number of periods of the input voltage, wherein X is an integer greater than or equal to one.

9. The method of claim 7 wherein the one or more components of power delivered to the load comprise one or more members of a group consisting of a current to the load and the input voltage to the load.

10. The method of claim 7 wherein determining the total harmonic distortion of the one or more components of power delivered to the load comprises determining the total harmonic distortion using a Goertzel algorithm based on a fundamental line frequency of the input voltage for the integer count of the samples of the input voltage that occur during X number of periods of the input voltage, wherein X is an integer greater than or equal to one.

11. The method of claim 7 wherein:
sensing an occurrence of a period of one or more cycles of a periodic input voltage to a load comprises:
detecting a beginning and an ending zero crossing of the period; and
correlating a count of the samples to period of the input voltage comprises:
determining the integer count of the integer number of samples to equal the number of samples of the input voltage that occur from the beginning zero crossing of the period of the periodic input voltage to the last zero crossing of the period of the periodic voltage.

12. The method of claim 7 wherein the period of the input voltage is P cycles of the periodic input voltage, where P is an integer greater than or equal to one.

13. An apparatus comprising:
a power measurement system, wherein the power measurement system is configured to:
sense an occurrence of a period of a periodic input voltage to a load;
obtain samples of total harmonic calculation parameters;
correlate an integer number of samples of the total harmonic distortion calculation parameters to the sensed period of the voltage input so that the integer number of samples used for determining total harmonic distortion of one or more components of power delivered to the load varies with changes in the period of the periodic input voltage;
determine the total harmonic distortion of the one or more components of power delivered to the load using the integer number of samples of the total harmonic calculation parameters that are correlated with the sensed period of the input voltage and using only an integer number of full values of the total harmonic calculation parameters for each determination of the total harmonic distortion;
provide access to the determined total harmonic distortion.

14. The apparatus of claim 13 further comprising:
an analog-to-digital converter to sample the input voltage to the load, wherein the one or more total harmonic distortion calculation parameters comprises an integer number of samples of the input voltage that occur during X number of periods of the input voltage, wherein X is an integer greater than or equal to one; and
to determine the total harmonic distortion of the one or more components of power delivered to the load using the one or more calculation parameters comprises to determine the total harmonic distortion of the one or more components of power delivered to the load using the integer number of samples of the input voltage that occur during X number of periods of the input voltage.

15. The apparatus of claim 14 wherein the one or more components of power delivered to the load comprise one or more members of a group consisting of a current to the load and the input voltage to the load.

16. The apparatus of claim 15 wherein to determine the total harmonic distortion of the one or more components of power delivered to the load comprises to determine the total harmonic distortion using a Goertzel algorithm based on a fundamental line frequency of the input voltage for the integer number of samples of the input voltage that occur during X number of periods of the input voltage.

17. The apparatus of claim 13 wherein:
to sense an occurrence of a period of a periodic input voltage to a load comprises:
detecting a beginning and an ending zero crossing of each of P cycles of the periodic input voltage, where P is an integer greater than or equal to one; and
the power measurement system is further configured to:
sample the input voltage to the load; and
track an integer number of samples of the input voltage to the load that occur from a beginning zero crossing of the period of the periodic input voltage to a last zero crossing of the period of the periodic voltage; and
the one or more total harmonic distortion calculation parameters comprises the integer number of samples of the input voltage that occur from the beginning zero crossing of the first of the one or more periods of the periodic input voltage to the last zero crossing of the one or more periods of the periodic voltage.

18. The apparatus of claim 13 wherein the period of the input voltage is P cycles of the periodic input voltage, where P is an integer greater than or equal to one.

19. An apparatus comprising:
a power measurement system, wherein the power measurement system is configured to:
sense an occurrence of a period of one or more cycles of a periodic input voltage to a load;
sample one or more components of power delivered to the load to obtain samples of the one or more components;
correlate an integer count of an integer number of the samples to the period of the input voltage so that the count of the integer number of samples used for determining total harmonic distortion of one or more components of power delivered to the load varies with changes in the period of the periodic input voltage;
determine the total harmonic distortion of the one or more components of power delivered to the load using the correlating integer count of the integer number of samples and using only an integer number of full values of the one or more components of power for each determination of the total harmonic distortion; and
provide access to the determined total harmonic distortion.

20. The apparatus of claim 19 wherein to determine the total harmonic distortion of the one or more components of power delivered to the load comprises to determine the total harmonic distortion of the one or more components of power delivered to the load using the integer count of the integer number of samples of the input voltage that occur during X number of periods of the input voltage, wherein X is an integer greater than or equal to one.

21. The apparatus of claim 19 wherein the one or more components of power delivered to the load comprise one or more members of a group consisting of a current to the load and the input voltage to the load.

22. The apparatus of claim 19 wherein to determine the total harmonic distortion of the one or more components of power delivered to the load comprises to determine the total harmonic distortion using a Goertzel algorithm based on a fundamental line frequency of the input voltage for the integer count of the integer number of samples of the input voltage that occur during X number of periods of the input voltage, wherein X is an integer greater than or equal to one.

23. The apparatus of claim 19 wherein:
to sense an occurrence of a period of one or more cycles of a periodic input voltage to a load comprises:
to detect a beginning and an ending zero crossing of the period; and
to correlate an integer count of the integer number of samples to period of the input voltage comprises:
to determine the integer count of the integer number samples to equal the number of samples of the input voltage that occur from the beginning zero crossing of the period of the periodic input voltage to the last zero crossing of the period of the periodic voltage.

24. The apparatus of claim 19 wherein the period of the input voltage is P cycles of the periodic input voltage, where P is an integer greater than or equal to one.

* * * * *